United States Patent [19]

D'Luna et al.

[11] Patent Number: 5,086,344
[45] Date of Patent: Feb. 4, 1992

[54] DIGITAL CORRELATED DOUBLE SAMPLING CIRCUIT FOR SAMPLING THE OUTPUT OF AN IMAGE SENSOR

[75] Inventors: Lionel J. D'Luna; William A. Cook; Kenneth A. Parulski, all of Rochester, N.Y.

[73] Assignee: Eastman Kodak Company, Rochester, N.Y.

[21] Appl. No.: 522,030

[22] Filed: May 11, 1990

[51] Int. Cl.$^5$ .................. H04N 5/14; H04N 5/335; H04N 5/213

[52] U.S. Cl. ..................... 358/213.15; 358/213.26; 358/167; 358/213.18

[58] Field of Search .............. 358/213.15, 213.21, 358/167, 213.27, 213.18, 213.26

[56] References Cited

U.S. PATENT DOCUMENTS

| | | | |
|---|---|---|---|
| 4,283,742 | 8/1981 | Izumita et al. | |
| 4,287,441 | 9/1981 | Smith. | |
| 4,549,215 | 10/1985 | Levine | 358/213.15 |
| 4,556,851 | 12/1985 | Levine | 358/213.18 |
| 4,644,287 | 2/1987 | Levine | 358/213.15 |
| 4,667,490 | 6/1987 | Levine | 358/213.26 |
| 4,689,808 | 8/1987 | Moorman et al. | 358/213.26 |
| 4,716,317 | 12/1987 | Spierings | 358/213.26 |
| 4,719,512 | 1/1988 | Endo et al. | 358/213.26 |
| 4,845,382 | 7/1989 | Eouzan et al. | |
| 4,873,574 | 10/1989 | Darby . | |
| 4,987,321 | 1/1991 | Toohey | 358/213.15 |

Primary Examiner—Howard W. Britton
Assistant Examiner—Wendy R. Greening
Attorney, Agent, or Firm—David M. Woods

[57] ABSTRACT

A digital correlated double sampling circuit employs three registers and a single clock signal to sample the output of a charge transfer device. The first register samples the reset reference value on the falling edge of the master clock cycle while the remaining two registers sample on the rising edge. The second register samples the image level and the third register samples the output of the first register, thus effecting a delay of the reset reference level. The outputs of the second and third registers, that is, the image level and the reset reference level, are differenced to provide a noise-free image signal.

7 Claims, 7 Drawing Sheets

DIGITAL CORRELATED DOUBLE SAMPLING CIRCUIT FOR SAMPLING THE OUTPUT OF AN IMAGE SENSOR

BACKGROUND OF THE INVENTION

1. Field of the Invention

This invention pertains to signal processing circuits for the dual sampling of correlated signals produced by image sensing devices, particularly charge-transfer devices.

2. Description Relative to the Prior Art

A signal processing technique known as correlated double sampling is commonly used to process the output signal from a charge-coupled device (CCD) image sensor in order to obtain low noise performance. Correlated double sampling is equivalent to subtracting a reset reference level ($V_{reset}$) from an image level ($V_{image}$) for each output pixel from the CCD image sensor.

Figure 1:
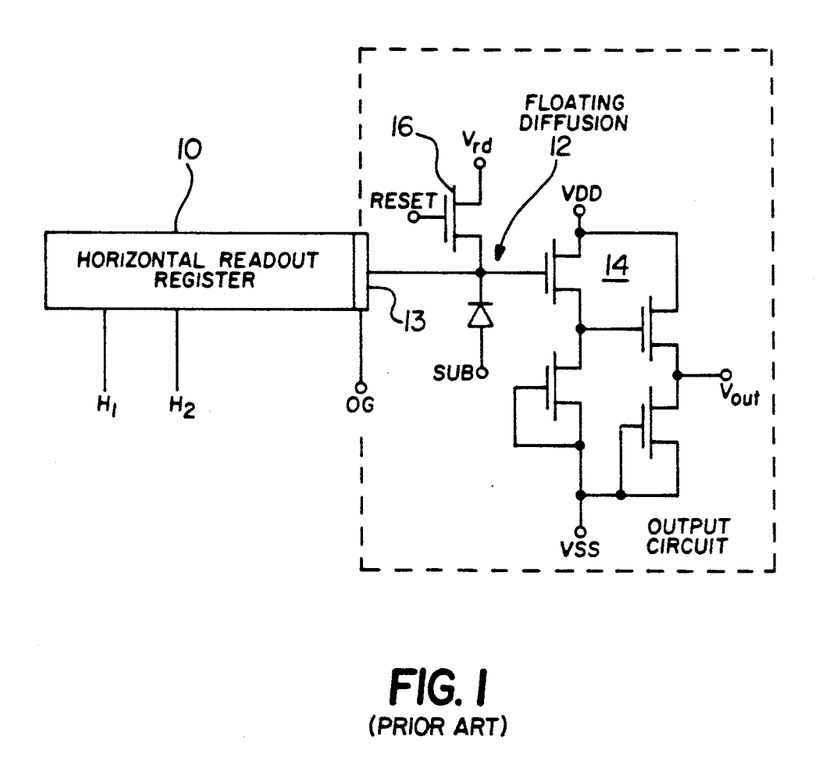
FIG. 1 is an example of a known output circuit for a charge transfer device.

A CCD output circuit, shown in FIG. 1, converts the photoelectrically generated signal charge to a voltage signal. Charge packets from the CCD imager photosites (not shown) are transferred into a horizontal shift register 10. The charge packets are shifted horizontally via horizontal clocks H1 and H2 and onto a floating diffusion output 12 via output gate 13. The potential of the floating diffusion 12 changes linearly in proportion to the number of electrons in the charge packet. The potential of the floating diffusion 12 is applied to the input gate of a two stage source follower circuit 14, producing a signal at $V_{out}$. A reset transistor 16 driven by the reset clock RESET recharges the floating diffusion 12 to the positive potential $V_{rd}$ before the arrival of each new charge packet from the horizontal shift register 10.

Figure 2:
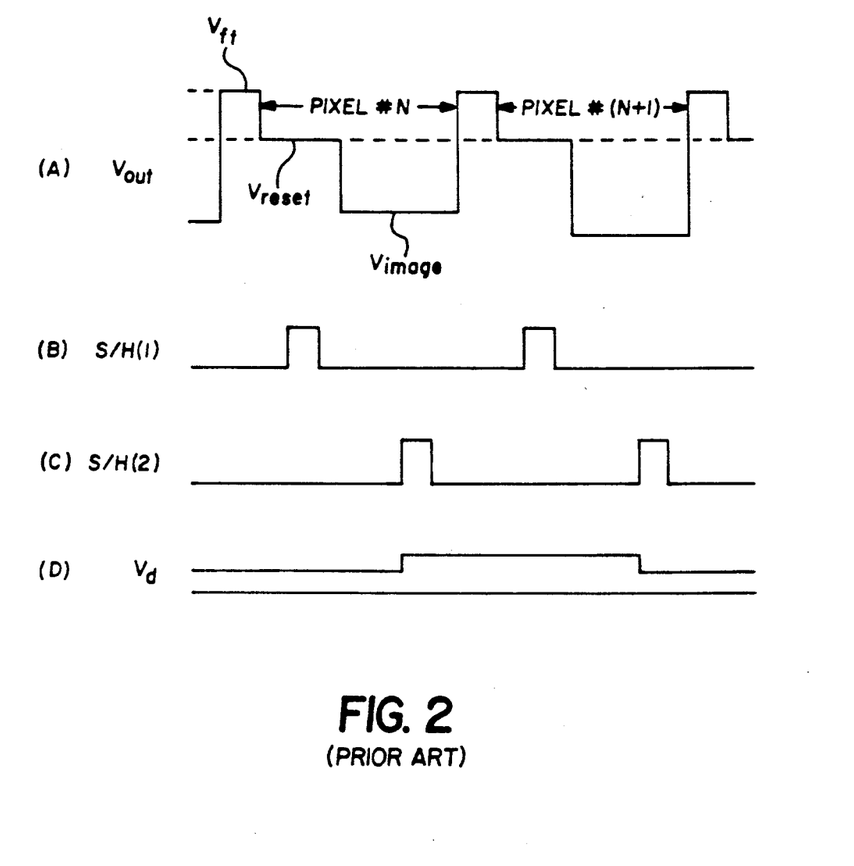
FIG. 2 shows the signal waveform (FIG. 2(A)) developed by the known circuit of FIG. 1 and illustrates (FIGS. 2(B), 2(C)) the points at which the waveform may be double sampled to obtain an image signal difference waveform (FIG. 2(D)).

FIG. 2(A) shows the signal waveform $V_{out}$ at the output of the source follower 14. The waveform contains three components: the reset clock feedthrough ($V_{ft}$), the reset reference level ($V_{reset}$), and the image level ($V_{image}$). The feed through $V_{ft}$ occurs as a result of capacitive coupling between the RESET gate 16 and the floating diffusion 12. When the floating diffusion 12 is reset, the exact reset voltage is affected by "thermal" noise, whose level depends on the capacitance of the floating diffusion 12 and the temperature. The same random reset noise voltage affects the level of both the reference level $V_{reset}$ and the image level $V_{image}$. By taking the difference between samples of $V_{reset}$ and $V_{image}$ for each pixel, this "thermal" noise can be eliminated. This also reduces low frequency noise from the two stage source follower output amplifier 14.

Figure 3:
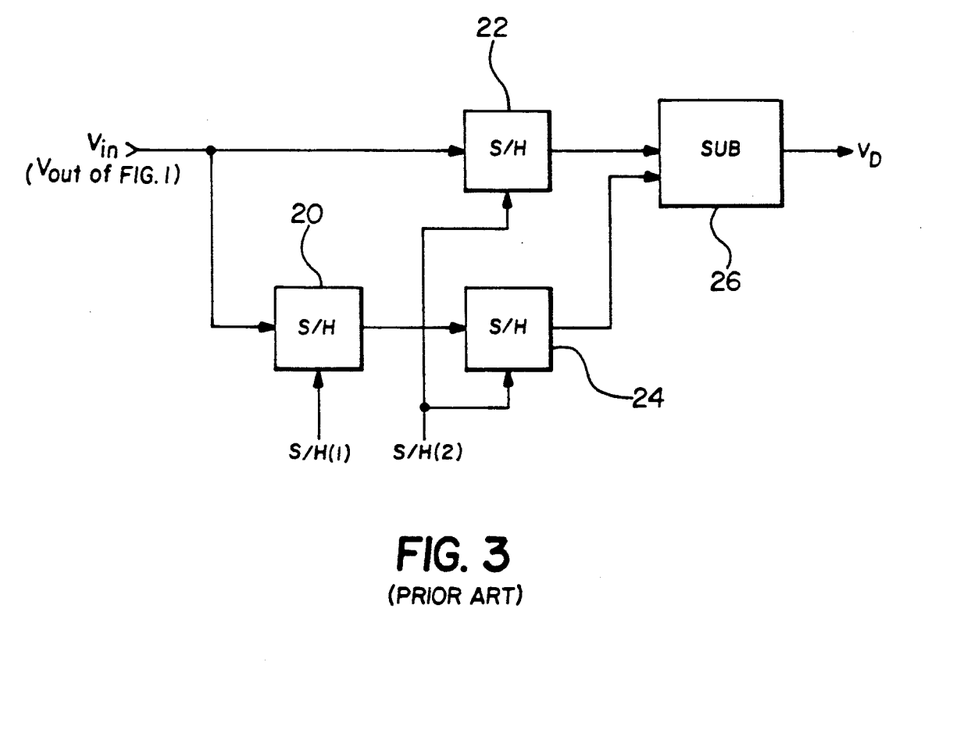
FIG. 3 is an example of a known circuit for performing correlated double sampling of the waveform of FIG. 2(A) according to the sample waveforms of FIGS. 2(B) and 2(C).

A commonly known circuit for performing correlated double sampling is shown in FIG. 3 (see, for example, the circuits disclosed in U.S. Pat. Nos. 4,283,742 and 4,845,382). The signal $V_{out}$ from the circuit of FIG. 1 forms the input signal $V_{in}$ to sample/hold circuits 20 and 22, and the output of the sample/hold circuit 20 is further sampled by a sample/hold circuit 24. The aforementioned difference signal $V_D$ is taken between the outputs of the sample/hold circuits 22 and 24 by a subtracting circuit 26. FIGS. 2(B) and 2(C) show the sampling waveforms S/H(1) and S/H(2) that respectively drive the sample/hold circuit 20, and the sample/hold circuits 22 and 24. Sampling pulses from the waveform S/H(1) cause the sample/hold circuit 20 to sample the reset reference level ($V_{reset}$). Sampling pulses from the waveform S/H(2) cause the sample/hold circuit 22 to sample the image level ($V_{image}$), while simultaneously causing the sample/hold 24 to sample the output of the sample/hold circuit 20, thus effecting a delay in the reset reference level ($V_{reset}$). A noise-free image signal $V_D$ (shown in FIG. 2(D)) is then obtained from the differencing circuit 26 by taking the difference between the outputs of the sample/hold circuits 22 and 24.

SUMMARY OF THE INVENTION

The object of the present invention is to incorporate correlated doubling sampling into a digital application with as few complications as possible. More specifically, and unlike the circuits disclosed in the prior art, a digital correlated double sampling technique has been devised that relies on three digital registers and a single clock signal to perform the necessary double sampling of a digitized signal. The use of a single clock is a significant advantage when implementing this function on a custom integrated circuit.

The digitized signal is obtained from an output circuit that converts the image-bearing charge from picture elements (pixels) of the charge transfer device to a voltage signal and establishes a reference level that is correlated to the voltage signal. First and second registers are commonly connected to receive the digitized output signal and a third register is connected to receive the output of the first register. A clock signal is generated having a frequency equivalent to the pixel processing rate. The first register responds to like polarity transitions of the clock signal to store the reference level present during a first interval of the output signal. The second register responds to opposite polarity transitions of the clock signal to store the image level present during a second interval of the output signal, and the third register also responds to the opposite polarity transitions to store the output of the first register. A difference signal representative of noise-free image information is then obtained from the signals in the second and third registers.

BRIEF DESCRIPTION OF THE DRAWINGS

The prior art and the invention will be described in relation to the drawings, wherein.

DETAILED DESCRIPTION OF THE PREFERRED EMBODIMENT

Figure 4:
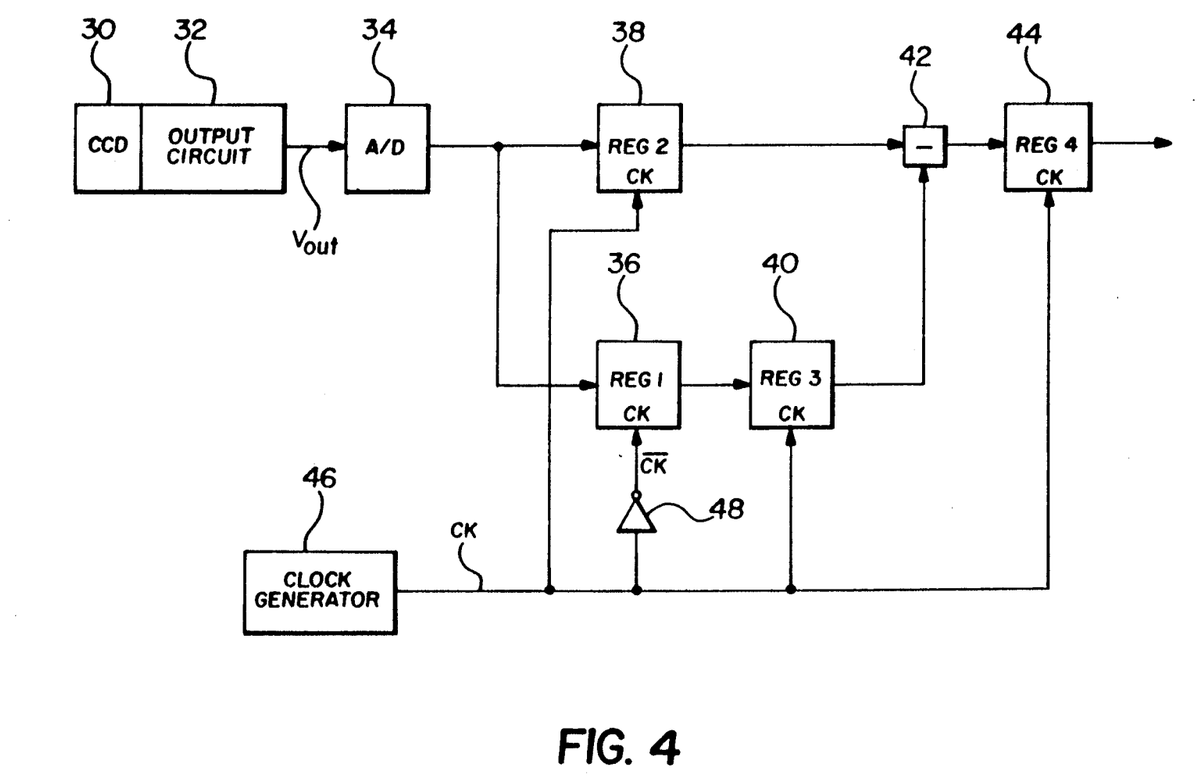
FIG. 4 is a block diagram of a preferred digital circuit for performing correlated double sampling according to the invention.

Referring now to FIG. 4, a charge transfer device 30 generates charge packets corresponding to an array of picture elements (pixels), and provides (upon suitable clocking, not shown) an image-bearing voltage signal from an on-chip output circuit 32, which may be substantially the same circuit as illustrated in FIG. 1. The resultant voltage signal $V_{out}$ is applied to a conventional analog/digital (A/D) converter 34 driven at a suitable sampling rate to convert the analog signal $V_{out}$ to a digitized image signal. The input ports of first and second registers 36 and 38 are commonly connected to receive the digitized output of the A/D converter 34. A third register 40 is connected to receive the output of the first register 36. A subtractor 42 is connected to receive at its input terminals the output signals from both registers 38 and 40. The resultant difference signal is provided to an output register 44. A clock generator 46 provides a master clock signal CK for actuating the storage operation of the registers 36, 38, 40, and 44. The clock signal CK has a frequency equivalent to the pixel processing rate of the circuit. More specifically, at the rising edge of a clock cycle, the signal present on each input port is latched into the respective register. By providing an inverter 48 in the clock input to the register 36, the signal present on the input port thereof is latched into the register 36 for every falling edge of the master clock cycle.

Figure 5:
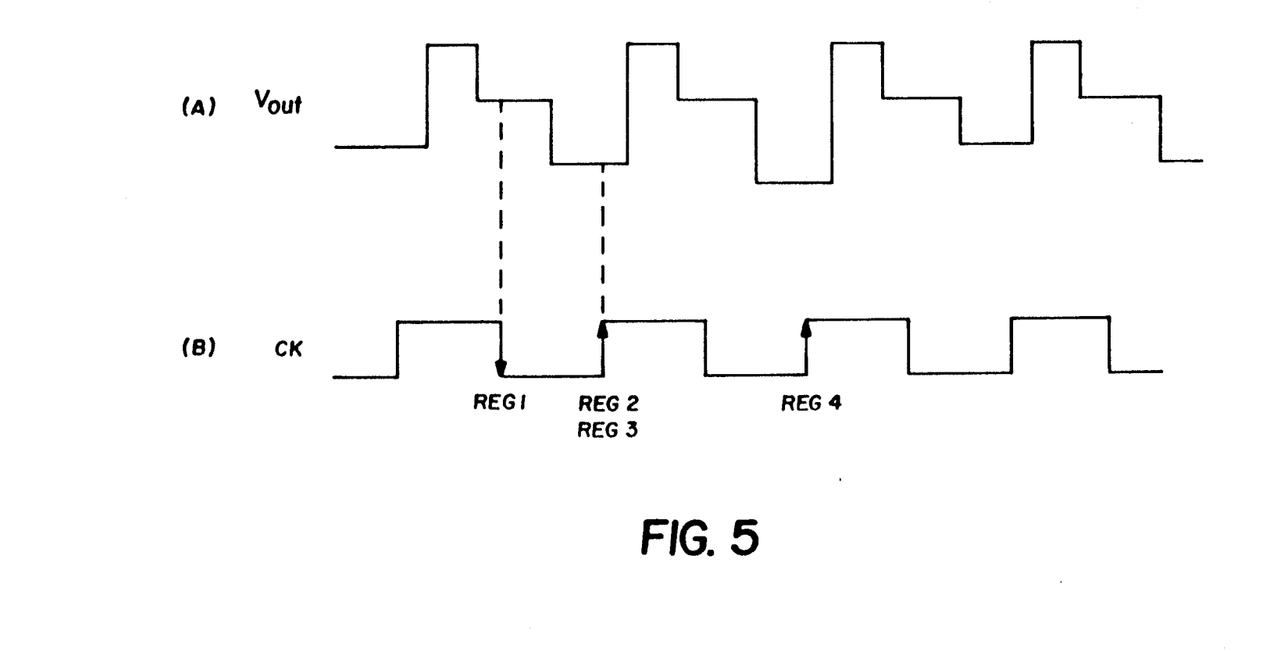
FIG. 5 illustrates the sampling waveform (FIG. 5(B)) used in the circuit of FIG. 4 to sample an image-bearing signal (FIG. 5(A))

In operation, and referring also to FIG. 5, digital correlated double sampling is performed by first latching the reset reference level ($V_{reset}$) into the first register 36 (REG1) on a falling edge of the master clock cycle. Next, two events happen in substantial simultaneity. The image level ($V_{image}$) is latched into the second register 38 (REG2) on a rising edge of the master clock cycle at the same time that the value ($V_{reset}$) in the first register 36 is latched into the third register 40 (REG3). The reset reference value ($V_{reset}$) is next subtracted from the image level ($V_{image}$) in the subtractor 42, and the difference signal is latched into the output register 44 (REG4) upon the next occurrence of a rising edge of the master clock cycle. Since the digitized image-bearing signals are being pipeline-processed through the sampling circuit, the respective registers operate on each falling or rising edge of the master clock cycle to continuously process a sequence of signals, i.e., as the register 44 latches the difference signal, the registers 38 and 40 are latching the next image signal and reset reference value, and so on.

Figure 6A:
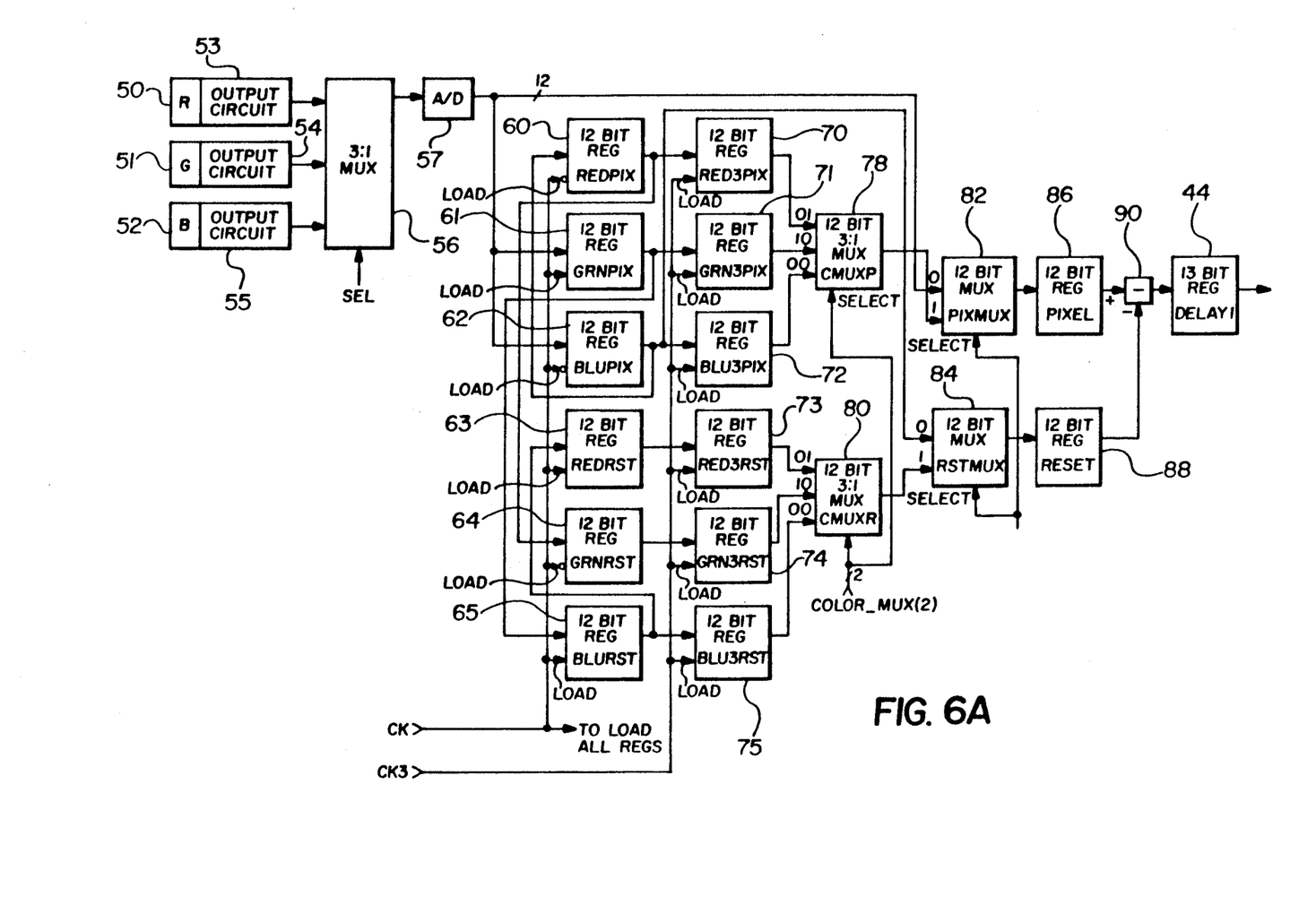
FIG. 6(A) is a block diagram a digital circuit according to a further embodiment of the invention for the correlated double sampling of three sequential color signals.
Figure 6B:
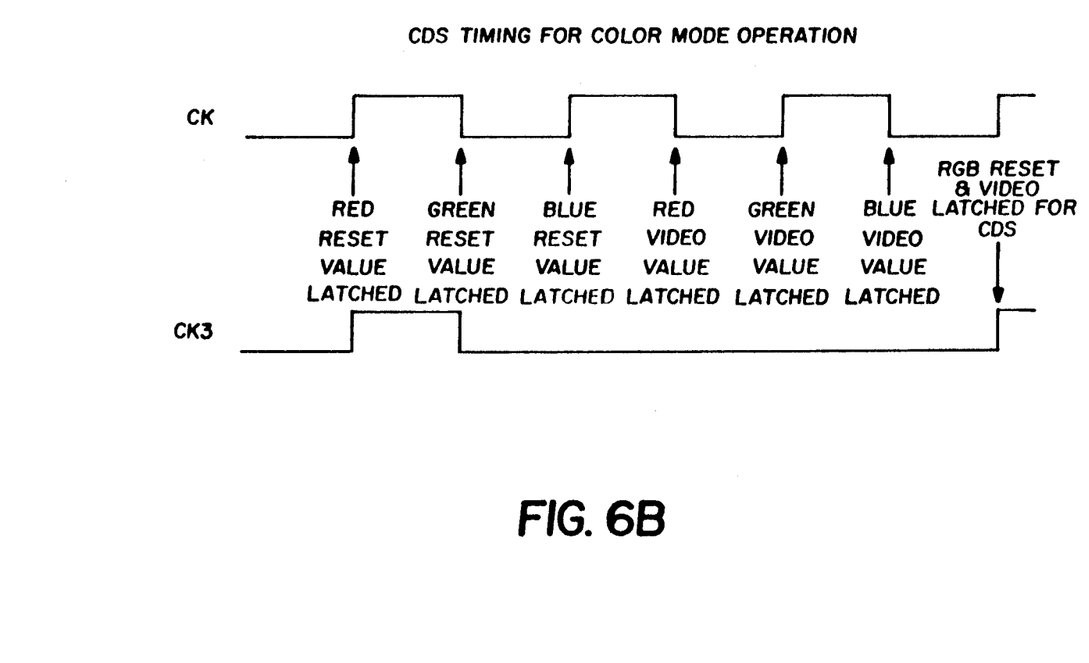
FIG. 6(B) is a timing diagram for the color mode of operation.

FIG. 6 illustrates a particular application for correlated double sampling in which three color-responsive charge transfer devices 50, 51 and 52 simultaneously output charge signals through respective output circuits 53, 54, and 55 to a multiplexer 56. Since the respective red, green, and blue reset reference values are present at the input of the multiplexer 56 before the corresponding image levels, the multiplexer 56 sequences the reset reference values through the A/D converter 57 before processing the respective image levels (e.g., red, reset, green reset, blue reset, followed by red image, green image, blue image, and so on). The alignment of the reset reference level to the respective image level, that is, the function performed by the registers 36, 38, and 40 in FIG. 4, is obtained by appropriately triggering (see FIG. 6(B)) the bank of registers 60 to 65. The registers 60 to 65 are connected in six pipelined sequences to define three pairs of signal channels, one channel of each pair providing the voltage level of a particular charge transfer device, and the other channel providing the reset reference level. Moreover, the register length of the channels differ by an odd number (usually, 1) of registers so that, when they are clocked, the reference level and the voltage level will be coincident at the end of a channel pair. The thus-aligned values are captured and held in a bank of registers 70 to 75, which are clocked at ⅓ (CK3) the pixel clock rate (CK). Multiplexers 78, 80 then sequentially access pairs of values in the registers 70 to 75 according to color (Red=01, Green=10, Blue=00) and apply the values through the multiplexers 82 and 84, and registers 86 and 88, to the subtractor 90, which produces a noise-free double-sampled difference signal. Single channel (typically monochrome) operation is obtained by selecting the "0" input to the multiplexers 82 and 84, which then collapses the circuit of FIG. 6 to essentially that of FIG. 4.

The invention has been described in detail with particular reference to a presently preferred embodiment, but it will be understood that variations and modifications can be effected within the spirit and scope of the invention.

What is claimed is:

1. A digital circuit for sampling an image-bearing signal from the output circuit of a charge transfer device in order to develop a noise-free difference signal, the output circuit converting the image-bearing charge from pixels of the charge transfer device to an image voltage signal and establishing a reset reference voltage a sequence of at least two intervals recurring at the pixel rate, a first interval during which the reset reference voltage is present and a second interval during which the image voltage signal is present, said digital circuit comprising:

means for digitizing the image-bearing signal from the output circuit of the charge transfer device;

means for generating a clock signal having a frequency equivalent to the pixel processing rate;

first and second registers commonly connected to receive the digitized signal from said digitizing means and a third register connected to receive the output of said first register, said first register responding to first polarity transitions of said clock signal to store the reset reference voltage present during the first interval of the digitized signal, said second and third registers responding to second polarity transitions of the clock signal opposite to said first transitions to store, respectively, the image voltage signal present during the second interval of the digitized signal and the signal output from said register; and subtracting means having inputs coupled to the outputs of said second and third registers for developing a noise-free difference signal from the difference between the input signals.

2. A digital circuit as claimed in claim 1 in which said first register latches its input on the falling edge of the clock signal and said second and third registers latch their respective inputs on the rising edge of the clock signal.

3. A digital circuit as claimed in claim 2 in which an inverter is connected between the clock signal output of said clock generating means and the clock input of said first register.

4. A digital circuit for sampling a plurality of image-bearing signals from the output circuits of a plurality of charge transfer devices in order to develop a like plurality of noise-free difference signals, each output circuit converting the image-bearing charge from the pixels of a respective charge transfer device to an image voltage signal and establishing a respective reset reference voltage, each image-bearing signal occurring over time in a sequence of at least two intervals recurring at a common pixel rate, a first interval during which the reset reference voltage is present and a second interval during which a respective image voltage signal is present, said digital circuit comprising:

a multiplexer receiving the image-bearing signals in parallel from each of the output circuits and providing a multiplexed signal in which the plurality of reset reference voltages are grouped together and precede the plurality of image voltage signals;

means for digitizing the multiplexed signal;

means for generating a clock signal having a frequency equivalent to the pixel processing rate;

a plurality of registers connected in a plurality of paired signal channels, each channel pair differing by an odd number of registers in length;

means for applying said clock signal to said plurality of registers so the image voltage signal and the reset reference voltage for a particular charge transfer device are coincident at the end of a channel pair;

means for selecting a particular channel pair and latching the signals in the channels into a pair of registers; and substracting means coupled to the output of said register pair for developing a noise-free difference signal from the difference of the signals stored therein.

5. A digital circuit as claimed in claim 4 for sampling three image-bearing signals from the output circuit of three charge transfer devices, wherein said plurality of registers comprises six registers interconnected to define three paired signal channels, each channel pair differing by one register in length.

6. A digital circuit as claimed in claim 5 wherein said selecting means comprises six registers for storing the respective image voltage signals and reset reference voltages of the three channels, and multiplexing means for selecting a particular image voltage signal and reset reference voltage from among the three pairs thereof.

7. A digital circuit as claimed in claim 5 in which the three image-bearing signals correspond to three colors.

* * * * *

UNITED STATES PATENT AND TRADEMARK OFFICE
CERTIFICATE OF CORRECTION

PATENT NO.   : 5,086,344
DATED        : February 4, 1992
INVENTOR(S)  : Lionel J. D'Luna, et al.

It is certified that error appears in the above-identified patent and that said Letters Patent is hereby corrected as shown below:

Column 4, line 31, after "reference voltage" add --, the image-bearing signal occurring over time in--.

Signed and Sealed this

Fifteenth Day of June, 1993

Attest:

MICHAEL K. KIRK

Attesting Officer

Acting Commissioner of Patents and Trademarks